(12) United States Patent
Yoon (10) Patent No.: US 12,142,589 B2
(45) Date of Patent: Nov. 12, 2024

(54) SEMICONDUCTOR DEVICE INCLUDING RESISTOR ELEMENT

(71) Applicant: SK hynix Inc., Icheon-si (KR)

(72) Inventor: Chan Ho Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/432,788

(22) Filed: Feb. 5, 2024

(65) Prior Publication Data

US 2024/0178172 A1 May 30, 2024

Related U.S. Application Data

(60) Division of application No. 17/887,385, filed on Aug. 12, 2022, now Pat. No. 11,929,336, which is a continuation of application No. 17/007,059, filed on Aug. 31, 2020, now Pat. No. 11,450,636.

(30) Foreign Application Priority Data

Apr. 17, 2020 (KR) .................. 10-2020-0046620

(51) Int. Cl.
| | |
|---|---|
| H01L 23/00 | (2006.01) |
| H01L 23/522 | (2006.01) |
| H01L 25/065 | (2023.01) |
| H01L 25/18 | (2023.01) |

(52) U.S. Cl.
CPC .......... *H01L 24/08* (2013.01); *H01L 23/5228* (2013.01); *H01L 25/0657* (2013.01); *H01L 25/18* (2013.01); *H01L 2224/08145* (2013.01); *H01L 2924/1431* (2013.01); *H01L 2924/14511* (2013.01); *H01L 2924/19043* (2013.01); *H01L 2924/19104* (2013.01)

(58) Field of Classification Search
None
See application file for complete search history.

(56) References Cited

U.S. PATENT DOCUMENTS

| | | | |
|---|---|---|---|
| 8,587,117 B2 * | 11/2013 | Takayama | ........... H01L 25/0657 257/723 |
| 2003/0040131 A1 | 2/2003 | Kai | |
| 2009/0321910 A1 | 12/2009 | Choi | |
| 2011/0102066 A1 | 5/2011 | Jin | |
| 2017/0033085 A1 * | 2/2017 | Shikibu | ............. H01L 23/49541 |
| 2019/0067157 A1 | 2/2019 | Lin | |
| 2019/0273090 A1 | 9/2019 | Fukuzumi | |
| 2019/0304905 A1 | 10/2019 | Wee et al. | |
| 2019/0355637 A1 * | 11/2019 | Chen | ....................... H01L 21/56 |
| 2020/0006299 A1 | 1/2020 | Liu et al. | |

FOREIGN PATENT DOCUMENTS

| | | |
|---|---|---|
| JP | 2018-148071 A | 9/2018 |
| KR | 10-2008-0088956 A | 10/2008 |

\* cited by examiner

*Primary Examiner* — Hung K Vu (57) ABSTRACT

A semiconductor device includes a first pad defined on one surface of a first chip; a second pad defined on one surface of a second chip which is stacked on the first chip, and bonded to the first pad; a first resistor element defined in the first chip, and coupled to the first pad; and a second resistor element defined in the second chip, and coupled to the second pad.

4 Claims, 7 Drawing Sheets

SEMICONDUCTOR DEVICE INCLUDING RESISTOR ELEMENT

CROSS-REFERENCE TO RELATED APPLICATION

The present application is a divisional application of a U.S. patent application Ser. No. 17/887,385, filed on Aug. 12, 2022, which is a continuation application of a U.S. patent application Ser. No. 17/007,059, filed on Aug. 31, 2020, now issued as U.S. Pat. No. 11,450,636 on Sep. 20, 2022, which claims priority under 35 U.S.C. § 119(a) to Korean Patent Application No. 10-2020-0046620 filed in the Korean Intellectual Property Office on Apr. 17, 2020, which is incorporated herein by reference in its entirety.

BACKGROUND

1. Technical Field

Various embodiments generally relate to a semiconductor technology, and more particularly, to a semiconductor device including a resistor element.

2. Related Art

Resistor elements are used in various circuits in a semiconductor device, for example, signal delay circuits, high-voltage stabilization circuits, reference voltage generation circuits and electrostatic discharge (ESD) protection circuits. As semiconductor devices are increasingly highly integrated, the proportion of an area, which is used to determine the size of a semiconductor device, occupied by the resistor elements is also increasing.

SUMMARY

Various embodiments are directed to measures capable of reducing area in a semiconductor device that is allocated to resistor elements, thereby contributing to a greater degree of integration of a semiconductor device.

Also, various embodiments are directed to measures capable of suppressing the occurrence of a failure due to the presence of resistor elements.

In an embodiment, a semiconductor device may include: a first pad defined on one surface of a first chip; a second pad defined on one surface of a second chip, which is stacked on the first chip, and bonded to the first pad; a first resistor element defined in the first chip and coupled to the first pad; and a second resistor element defined in the second chip and coupled to the second pad.

In an embodiment, a semiconductor device may include: a first pad defined on one surface of a first chip; a second pad defined on one surface of a second chip, which is stacked on the first chip in a first direction, and bonded to the first pad; a first vertical resistor pattern, defined in the first chip and coupled to the first pad, extending in the first direction; and a second vertical resistor pattern, defined in the second chip and coupled to the second pad, extending in the first direction.

In an embodiment, a semiconductor device may include: a first pad defined on one surface of a first chip; a second pad defined on one surface of a second chip, which is stacked on the first chip in a first direction, and bonded to the first pad; a first horizontal resistor pattern defined on the one surface of the first chip and coupled to the first pad; and a second horizontal resistor pattern defined on the one surface of the second chip and coupled to the second pad.

In an embodiment, a semiconductor device may include: a plurality of first pads defined on one surface of a first chip; a plurality of second pads defined on one surface of a second chip, which is stacked on the first chip in a first direction, and bonded to the plurality of first pads, respectively; a plurality of first vertical resistor patterns, defined in the first chip and coupled respectively to the plurality of first pads, extending in the first direction; a plurality of second vertical resistor patterns, defined in the second chip and coupled respectively to the plurality of second pads, extending in the first direction; a first wiring line coupling a pair of first vertical resistor patterns from among the plurality of first vertical resistor patterns; and a second wiring line coupling a pair of second vertical resistor patterns from among the plurality of second vertical resistor patterns. The plurality of first vertical resistor patterns, the plurality of second vertical resistor patterns, the plurality of first pads, the plurality of second pads, the first wiring line and the second wiring line may be coupled to one another and arranged to form a snake-like shape.

DETAILED DESCRIPTION

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various ways. The exemplary embodiments of the present disclosure convey the scope of the disclosure to those skilled in the art.

Since the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise.

Elements in embodiments of the disclosure should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Also, components in embodiments of the disclosure are not limited by these terms. These terms are used to merely distinguish one component from another component. Accordingly, as used herein, a first component may be a second component within the technical spirit of the disclosure.

Features of various exemplary embodiments of the disclosure may be coupled, combined or separated partially or totally. Technically various interactions and operations are possible. Various exemplary embodiments can be practiced individually or in combination.

In the following descriptions, a direction in which first and second chips are stacked is defined as a first direction FD, an arrangement direction of bit lines is defined as a second direction SD, and an extending direction of the bit lines is defined as a third direction TD. The second direction SD and the third direction TD may be parallel to a plane orthogonal to the first direction FD, and may intersect with each other. The second direction SD and the third direction TD may intersect substantially perpendicularly with each other. In the following descriptions, the term 'vertical' or 'vertical direction' will be used as substantially the same meaning as the first direction FD. In the drawings, a direction indicated by an arrow and a direction opposite thereto represent the same direction.

Hereinafter, various examples of embodiments of the disclosure will be described in detail with reference to the accompanying drawings.

Figure 1:
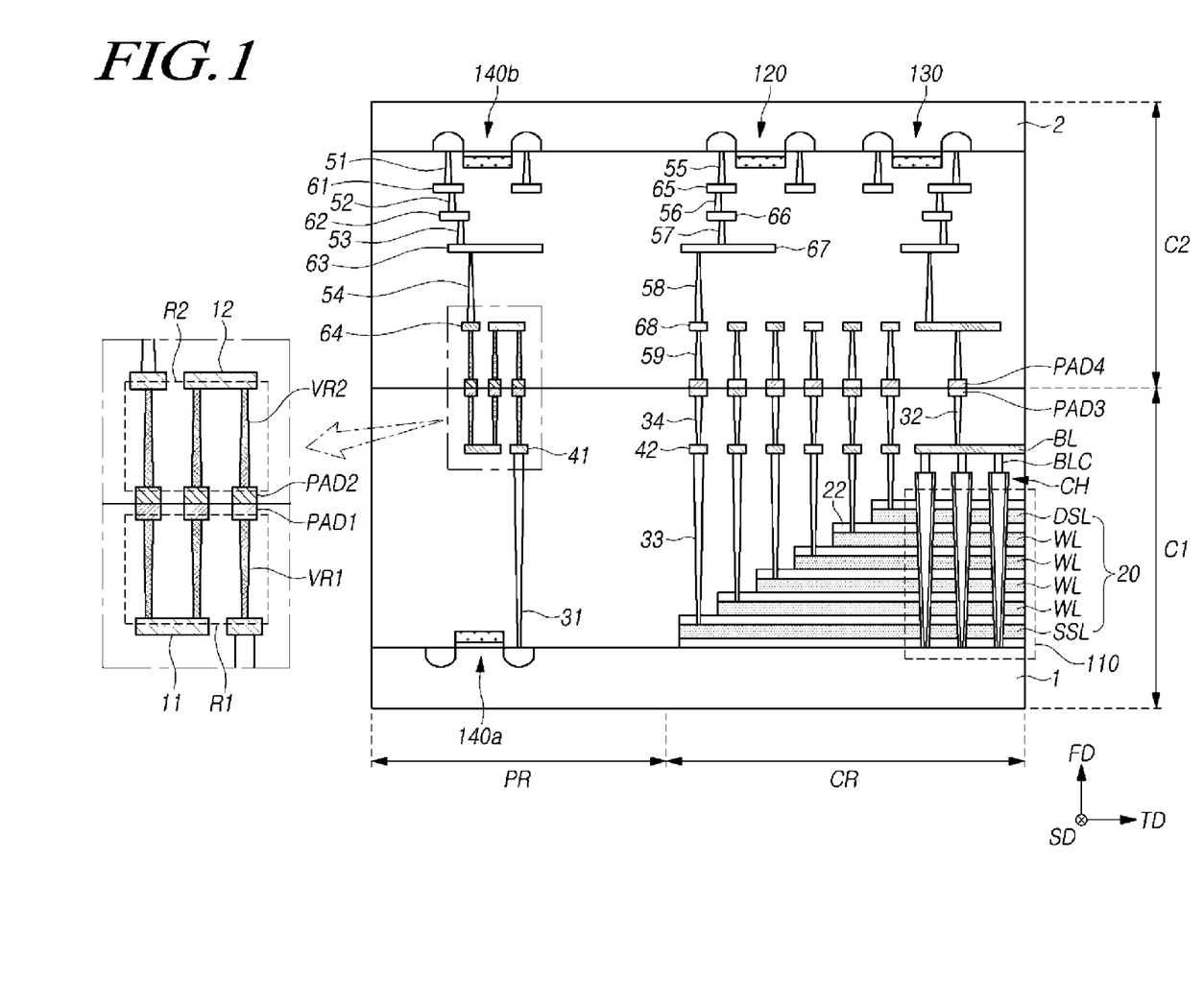
FIG. 1 is a cross-sectional view illustrating a representation of a semiconductor device in accordance with an embodiment of the disclosure.

FIG. 1 is a cross-sectional view illustrating a representation of a semiconductor device in accordance with an embodiment of the disclosure.

Referring to FIG. 1, a semiconductor device in accordance with an embodiment of the disclosure may include a first chip C1 and a second chip C2 that is stacked on the first chip C1.

The first chip C1 may include a plurality of first vertical resistor patterns VR1. Although FIG. 1 shows that the plurality of first vertical resistor patterns VR1 are arranged in the third direction TD, it is not limited to that. The plurality of first vertical resistor patterns VR1 may be arranged in any direction on a plane defined by the second direction SD and the third direction TD. The first vertical resistor patterns VR1 may each have a pillar shape that extends in the first direction FD. The upper ends of the plurality of first vertical resistor patterns VR1 may be coupled to a plurality of first pads PAD1, respectively. The plurality of first vertical resistor patterns VR1 included in the first chip C1 may configure a first resistor element R1.

The second chip C2 may include a plurality of second vertical resistor patterns VR2. Although FIG. 1 shows that the plurality of second vertical resistor patterns VR2 are arranged in the third direction TD, it is not limited to that. The plurality of second vertical resistor patterns VR2 may be arranged in any direction on the plane defined by the second direction SD and the third direction TD. The second vertical resistor patterns VR2 may each have a pillar shape that extends in the first direction FD. The lower ends of the plurality of second vertical resistor patterns VR2 may be coupled to a plurality of second pads PAD2, respectively. The plurality of second vertical resistor patterns VR2 included in the second chip C2 may configure a second resistor element R2.

The plurality of first pads PAD1 and the plurality of second pads PAD2 may be bonded respectively to each other. Accordingly, the first resistor element R1 and the second resistor element R2 may be coupled to each other. A pair of a first vertical resistor pattern VR1 and a second vertical resistor pattern VR2 which are coupled to a pair of a first pad PAD1 and a second pad PAD2 bonded to each other may overlap each other in the first direction FD.

The lower ends of a pair of adjacent first vertical resistor patterns VR1 may be coupled to each other through a first wiring line 11, which is defined in the first chip C1. The upper ends of a pair of adjacent second vertical resistor patterns VR2 may be coupled to each other through a second wiring line 12, which is defined in the second chip C2. As illustrated in FIG. 1, the plurality of first vertical resistor patterns VR1, the plurality of second vertical resistor patterns VR2, the plurality of first pads PAD1, the plurality of second pads PAD2, the first wiring line 11 and the second wiring line 12 may be coupled to one another in series between wiring lines 41 and 64 (described below), while forming a snake-like shape or a square wave-like shape with a baseline represented by the interface of first chip C1 and second chip C2.

Although FIG. 1 illustrates an embodiment that includes a plurality of the first vertical resistor pattern VR1, a plurality of the second vertical resistor pattern VR2, a plurality of the first pad PAD1 and a plurality of the second pad PAD2, it is to be noted that the disclosure is not limited thereto. Other embodiments may include one or at least two of each of the first vertical resistor pattern VR1, the second vertical resistor pattern VR2, the first pad PAD1 and the second pad PAD2.

In FIG. 1, the semiconductor device may be divided into a cell region CR and a peripheral region PR. The first chip C1 may include a first substrate 1, and a plurality of electrode layers 20 and a plurality of interlayer dielectric layers 22, which are alternately stacked on the first substrate 1 in the cell region CR. The electrode layers 20 may include a conductive material. The interlayer dielectric layers 22 may include silicon oxide.

Among the electrode layers 20, at least one electrode layer 20, when viewed from the lowermost electrode layer 20, may configure a source select line SSL. Among the electrode layers 20, at least one electrode layer 20, when viewed from the uppermost electrode layer 20, may configure a drain select line DSL. The electrode layers 20 between the source select line SSL and the drain select line DSL may configure word lines WL.

A plurality of vertical channels CH that pass through the electrode layers 20 and the interlayer dielectric layers 22 may be defined in the cell region CR. While not illustrated, each of the vertical channels CH may include a channel layer and a gate dielectric layer. The gate dielectric layer may have the shape of a straw or a cylindrical shell that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured in regions or areas in which the source select line SSL surrounds the vertical channels CH. Memory cells may be configured in regions or areas in which the word lines WL surround the vertical channels CH. Drain select transistors may be configured in regions or areas in which the drain select line DSL surrounds the vertical channels CH. The drain select transistor, the plurality of memory cells and the source select transistor disposed along one vertical channel CH may configure a cell string. A plurality of cell strings corresponding to the plurality of vertical channels CH may be defined in the cell region CR of the first chip C1. The plurality of cell strings may configure a memory cell array 110.

A bit line BL may be defined over the vertical channels CH. The plurality of vertical channels CH may be coupled to the bit line BL through bit line contacts BLC. Although FIG. 1 illustrates only one bit line BL, it should be understood that a plurality of bit lines, extending in the second direction SD, may be provided.

The first chip C1 may include a plurality of third pads PAD3 on one surface thereof. The bit line BL may be coupled to one of the third pads PAD3 through a contact 32. Each of the electrode layers 20 may be coupled to one of the third pads PAD3 through contacts 33 and 34, and a wiring line 42. The second chip C2 may include a plurality of fourth pads PAD4, which are bonded to the plurality of third pads PAD3, on one surface thereof facing the first chip C1. Each of the fourth pads PAD4 may be coupled to one of a row decoder 120 and a page buffer circuit 130 through contacts 55 to 59 and wiring lines 65 to 68.

The semiconductor device may include a logic circuit for controlling the operation of the memory cell array 110. The logic circuit may include the row decoder 120, the page buffer circuit 130, and a peripheral circuit.

The row decoder 120 and the page buffer circuit 130 may be disposed in the second chip C2. For instance, the row decoder 120 and the page buffer circuit 130 may be disposed in the cell region CR of a substrate 2 of the second chip C2.

The peripheral circuit may be defined as circuits remaining in the logic circuit after excluding the row decoder 120 and the page buffer circuit 130, and may include a first peripheral circuit 140a, a second peripheral circuit 140b, the first resistor element R1 and the second resistor element R2.

The first peripheral circuit 140a may be disposed in the first chip C1, and the second peripheral circuit 140b may be disposed in the second chip C2. For instance, the first peripheral circuit 140a may be disposed in the peripheral region PR of the substrate 1 of the first chip C1, and the second peripheral circuit 140b may be disposed in the peripheral region PR of the substrate 2 of the second chip C2.

The first resistor element R1 may be disposed in the peripheral region PR of the first chip C1, and the second resistor element R2 may be disposed in the peripheral region PR of the second chip C2. The first resistor element R1 may be coupled to the first peripheral circuit 140a through a contact 31 and a wiring line 41. The second resistor element R2 may be coupled to the second peripheral circuit 140b through contacts 51 to 54 and wiring lines 61 to 64. The first resistor element R1 may overlap with at least one of the first peripheral circuit 140a and the second peripheral circuit 140b in the first direction FD. The second resistor element R2 may overlap with at least one of the first peripheral circuit 140a and the second peripheral circuit 140b in the first direction FD. Since the first resistor element R1 and the second resistor element R2 may share a layout area with the first peripheral circuit 140a and/or the second peripheral circuit 140b, the layout area consumed for the disposition of the resistor elements R1 and R2 may be reduced.

The first and second resistor elements R1 and R2 may be configured by utilizing a process for forming components existing in the first and second chips C1 and C2, without introducing a separate process to configure the first and second resistor elements R1 and R2. The first vertical resistor patterns VR1 of the first resistor element R1 may be formed at the same process step as the contacts 32 and 34, and may be made of the same material as the contacts 32 and 34. The second vertical resistor patterns VR2 may be formed at the same process step as the contacts 59, and may be made of the same material as the contacts 59. Because it is not necessary to introduce a separate process to configure the first and second resistor elements R1 and R2, it is possible to reduce manufacturing time and manufacturing cost and to suppress the occurrence of failures during additional manufacturing processes.

Although embodiments of the disclosure may describe a semiconductor device as a vertical NAND flash device, it is to be understood that the technical spirit of the disclosure is not limited thereto.

Figure 2:
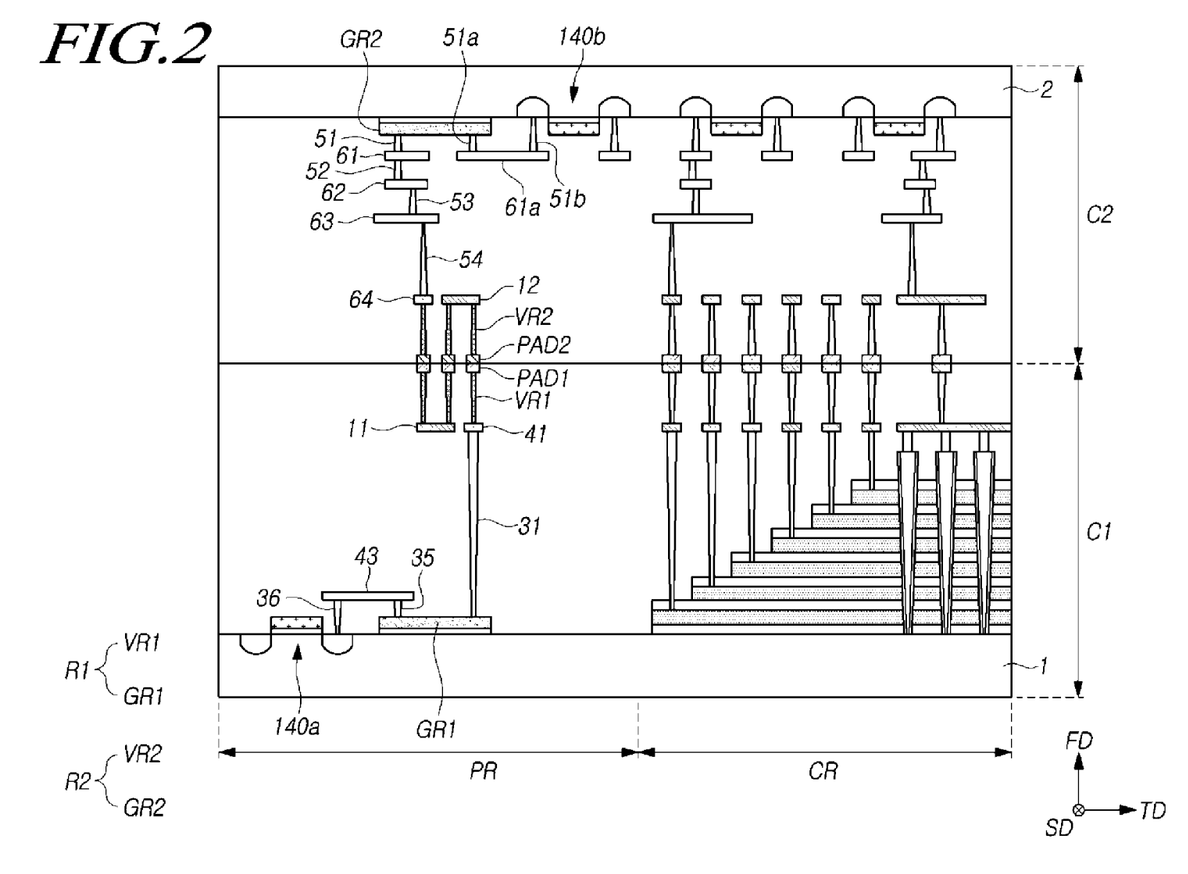
FIGS. 2 to 4 are cross-sectional views illustrating representations of semiconductor devices in accordance with other embodiments of the disclosure.

FIG. 2 is a cross-sectional view illustrating a representation of a semiconductor device in accordance with another embodiment of the disclosure.

Referring to FIG. 2, a first chip C1 may include a plurality of first vertical resistor patterns VR1, and a plurality of first pads PAD1, which are defined on one surface of the first chip C1 and are coupled to the first vertical resistor patterns VR1, respectively. In addition, the first chip C1 may further include a first gate resistor pattern GR1.

Each of the first vertical resistor patterns VR1 may have a pillar shape that extends in the first direction FD, and the upper ends of the plurality of first vertical resistor patterns VR1 may be coupled to the plurality of first pads PAD1, respectively.

The first gate resistor pattern GR1 may be disposed on a substrate 1 in a peripheral region PR of the first chip C1. The first gate resistor pattern GR1 may be formed at the same process step as the gate electrode of a transistor included in a first peripheral circuit 140a, and may be made of the same material as the gate electrode of the transistor included in the first peripheral circuit 140a. One end of the first gate resistor pattern GR1 may be coupled to the first peripheral circuit 140a through contacts 35 and 36 and a wiring line 43, and the other end of the first gate resistor pattern GR1 may be coupled to one of the first vertical resistor patterns VR1 through a contact 31 and a wiring line 41.

A second chip C2 may include a plurality of second vertical resistor patterns VR2, and a plurality of second pads PAD2 that are defined on one surface of the second chip C2 and are coupled to the plurality of second vertical resistor patterns VR2, respectively. In addition, the second chip C2 may further include a second gate resistor pattern GR2.

Each of the second vertical resistor patterns VR2 may have a pillar shape that extends in the first direction FD. The lower ends of plurality of the second vertical resistor patterns VR2 may be coupled to the plurality of second pads PAD2, respectively.

The second gate resistor pattern GR2 may be disposed on a substrate 2 in a peripheral region PR of the second chip C2. The second gate resistor pattern GR2 may be formed at the same process step as the gate electrode of a transistor included in a second peripheral circuit 140*b*, and may be made of the same material as the gate electrode of the transistor included in the second peripheral circuit 140*b*. One end of the second gate resistor pattern GR2 may be coupled to the second peripheral circuit 140*b* through contacts 51*a* and 51*b* and a wiring line 61*a*, and the other end of the second gate resistor pattern GR2 may be coupled to one of the second vertical resistor patterns VR2 through contacts 51 to 54 and wiring lines 61 to 64.

The plurality of first vertical resistor patterns VR1 and the first gate resistor pattern GR1 included in the first chip C1 may configure a first resistor element R1. The plurality of second vertical resistor patterns VR2 and the second gate resistor pattern GR2 included in the second chip C2 may configure a second resistor element R2. The plurality of first pads PAD1 and the plurality of second pads PAD2 may be bonded to each other. Accordingly, the first resistor element R1 and the second resistor element R2 may be coupled to each other.

The first gate resistor pattern GR1 may overlap with at least one of the first vertical resistor patterns VR1 and the second vertical resistor patterns VR2 in the first direction FD. The second gate resistor pattern GR2 may overlap with at least one of the first vertical resistor patterns VR1 and the second vertical resistor patterns VR2 in the first direction FD. Thus, the first gate resistor pattern GR1 and the second gate resistor pattern GR2 may share a layout area with the first vertical resistor patterns VR1 and/or the second vertical resistor patterns VR2, and a high resistance resulting from the resistor patterns may be configured in a smaller layout area.

Figure 3:
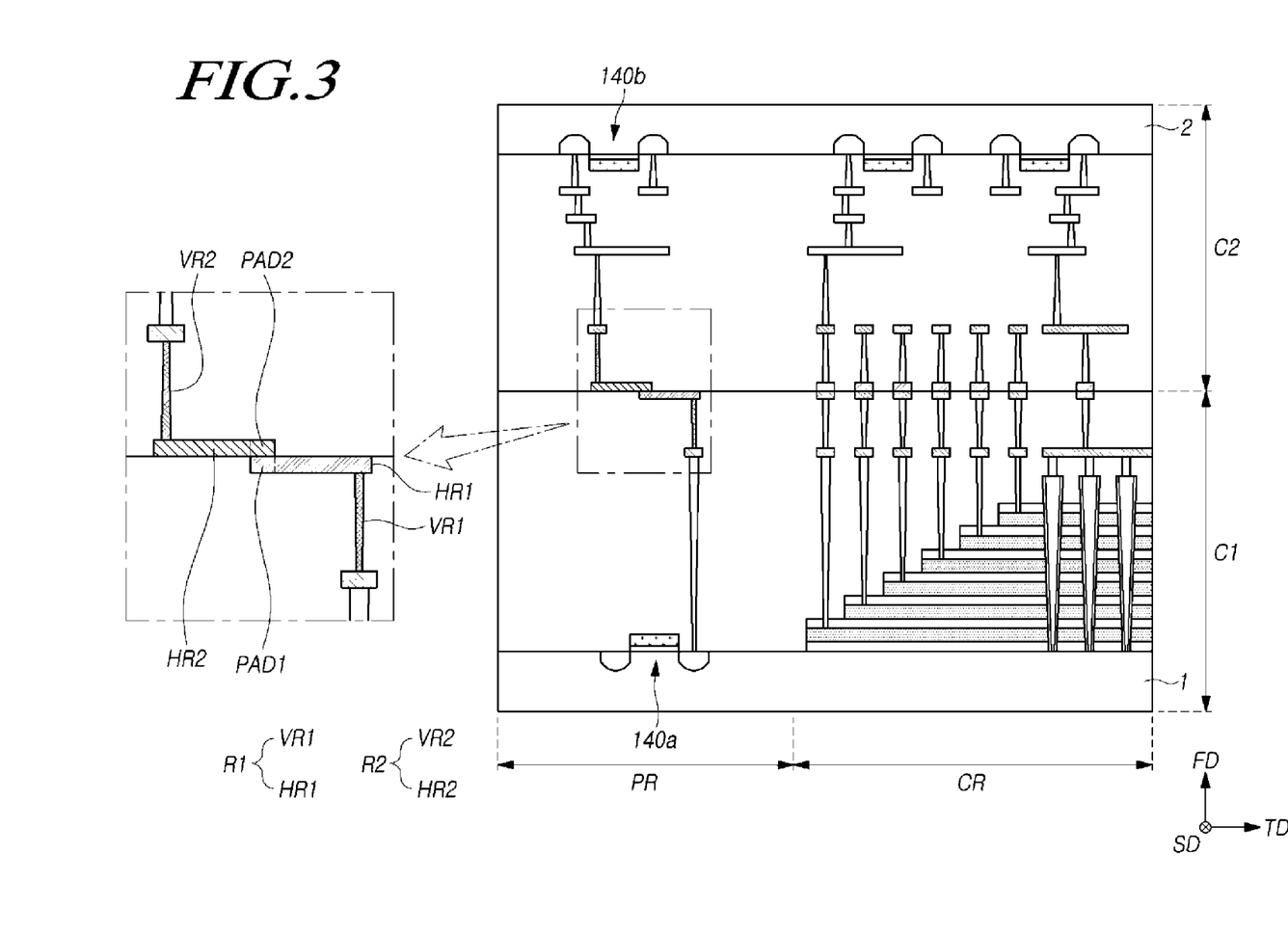

FIG. 3 is a cross-sectional view illustrating a representation of a semiconductor device in accordance with still another embodiment of the disclosure.

Referring to FIG. 3, a first chip C1 may include a first horizontal resistor pattern HR1, which is defined on one surface of the first chip C1. In addition, the first chip C1 may further include a first vertical resistor pattern VR1.

The first horizontal resistor pattern HR1 may be coupled to a first pad PAD1, which is defined on the one surface of the first chip C1. The first horizontal resistor pattern HR1 may be formed at the same process step as the first pad PAD1, and may be made of the same material as the first pad PAD1.

The first vertical resistor pattern VR1 may have a pillar shape that extends in the first direction FD. The upper end of the first vertical resistor pattern VR1 may be coupled to the first horizontal resistor pattern HR1. One end of the first horizontal resistor pattern HR1 may be coupled to the first vertical resistor pattern VR1, and the other end of the first horizontal resistor pattern HR1, which is opposite to the one end, may be coupled to the first pad PAD1.

A second chip C2 may include a second horizontal resistor pattern HR2 that is defined on one surface of the second chip C2. In addition, the second chip C2 may further include a second vertical resistor pattern VR2.

The second horizontal resistor pattern HR2 may be coupled to a second pad PAD2 that is defined on the one surface of the second chip C2. The second horizontal resistor pattern HR2 may be formed at the same process step as the second pad PAD2, and may be made of the same material as the second pad PAD2.

The second vertical resistor pattern VR2 may have a pillar shape that extends in the first direction FD. The lower end of the second vertical resistor pattern VR2 may be coupled to the second horizontal resistor pattern HR2. One end of the second horizontal resistor pattern HR2 may be coupled to the second vertical resistor pattern VR2, and the other end of the second horizontal resistor pattern HR2, which is opposite to the one end, may be coupled to the second pad PAD2.

The first vertical resistor pattern VR1 may overlap with the first horizontal resistor pattern HR1 in the first direction FD. The second vertical resistor pattern VR2 may overlap with the second horizontal resistor pattern HR2 in the first direction FD. The first horizontal resistor pattern HR1 and the second horizontal resistor pattern HR2 may not overlap with each other in the first direction FD. The first vertical resistor pattern VR1 and the second vertical resistor pattern VR2 may not overlap with each other in the first direction FD.

The first vertical resistor pattern VR1 and the first horizontal resistor pattern HR1 included in the first chip C1 may configure a first resistor element R1. The second vertical resistor pattern VR2 and the second horizontal resistor pattern HR2 included in the second chip C2 may configure a second resistor element R2. The first pad PAD1 and the second pad PAD2 may be bonded to each other, and accordingly, the first resistor element R1 and the second resistor element R2 may be coupled to each other.

The first resistor element R1 may overlap in the first direction FD with at least one of a first peripheral circuit 140*a* of the first chip C1 and a second peripheral circuit 140*b* of the second chip C2. The second resistor element R2 may overlap in the first direction FD with at least one of the first peripheral circuit 140*a* of the first chip C1 and the second peripheral circuit 140*b* of the second chip C2. Since the first resistor element R1 and the second resistor element R2 share a layout area with the first peripheral circuit 140*a* and/or the second peripheral circuit 140*b*, the layout area consumed for the disposition of the resistor elements R1 and R2 may be reduced.

Figure 4:
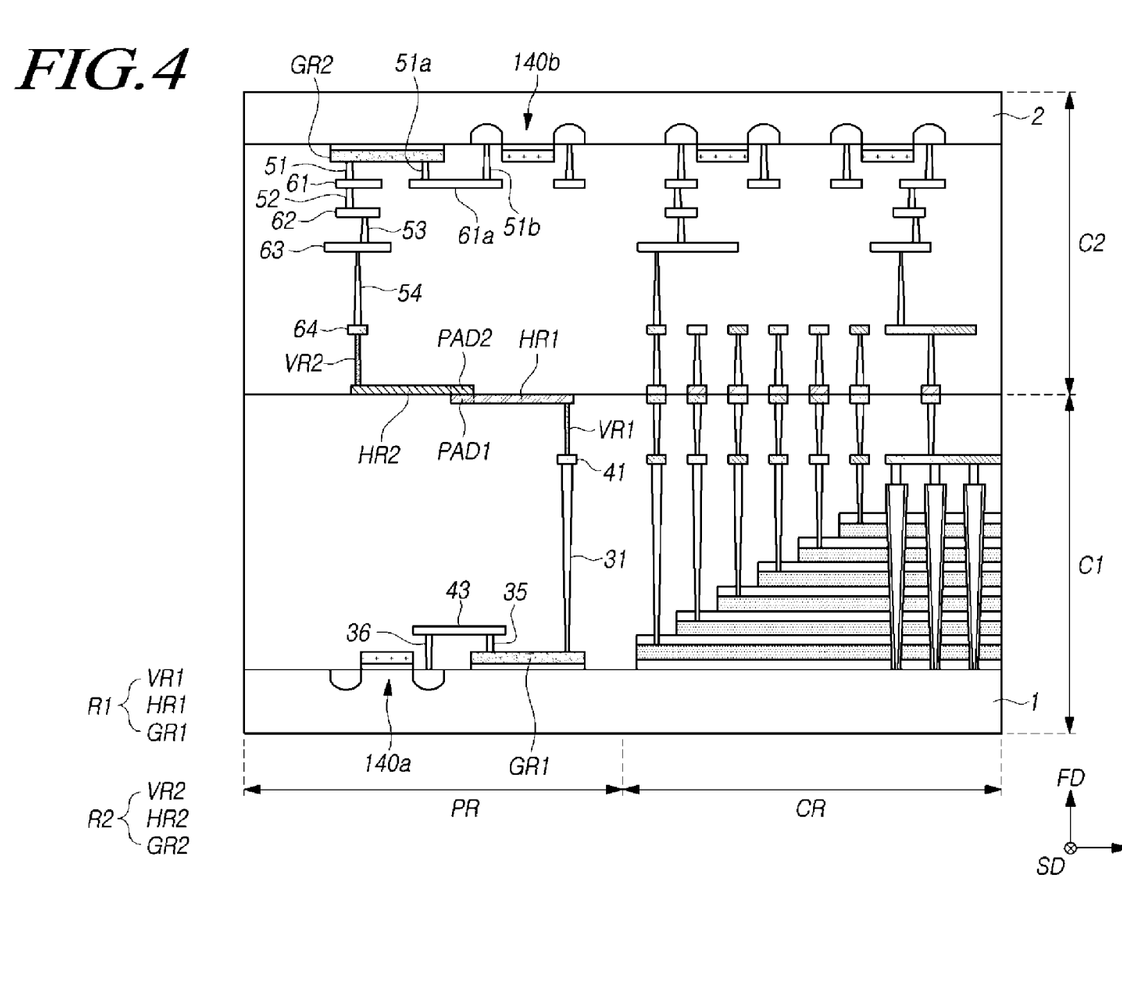

FIG. 4 is a cross-sectional view illustrating a representation of a semiconductor device in accordance with yet another embodiment of the disclosure.

Referring to FIG. 4, a first chip C1 may include a first horizontal resistor pattern HR1, a first vertical resistor pattern VR1 and a first gate resistor pattern GR1.

The first horizontal resistor pattern HR1 may be disposed on one surface of the first chip C1. The first vertical resistor pattern VR1 may have a pillar shape that extends in the first direction FD, and the upper end of the first vertical resistor pattern VR1 may be coupled to the first horizontal resistor pattern HR1. One end of the first horizontal resistor pattern HR1 may be coupled to the first vertical resistor pattern VR1, and the other end of the first horizontal resistor pattern HR1, which is opposite to the one end, may be coupled to a first pad PAD1 defined on the one surface of the first chip C1. The first vertical resistor pattern VR1 may overlap with the first horizontal resistor pattern HR1 in the first direction FD.

The first gate resistor pattern GR1 may be disposed on a substrate 1 of the first chip C1. The first gate resistor pattern GR1 may be formed at the same process step as the gate electrode of a transistor included in a first peripheral circuit 140*a*, and may be made of the same material as the gate electrode of the transistor included in the first peripheral circuit 140*a*.

One end of the first gate resistor pattern GR1 may be coupled to the first peripheral circuit 140*a* through contacts 35 and 36 and a wiring line 43, and the other end of the first gate resistor pattern GR1 may be coupled to the first vertical resistor pattern VR1 through a contact 31 and a wiring line 41.

A second chip C2 may include a second horizontal resistor pattern HR2, a second vertical resistor pattern VR2 and a second gate resistor pattern GR2. The second horizontal resistor pattern HR2 may be disposed on one surface of the second chip C2. The second vertical resistor pattern VR2 may have a pillar shape that extends in the first direction FD, and the lower end of the second vertical resistor pattern VR2 may be coupled to the second horizontal resistor pattern HR2. One end of the second horizontal resistor pattern HR2 may be coupled to the second vertical resistor pattern VR2, and the other end of the second horizontal resistor pattern HR2, which is opposite to the one end, may be coupled to a second pad PAD2 defined on the one surface of the second chip C2. The second vertical resistor pattern VR2 may overlap with the second horizontal resistor pattern HR2 in the first direction FD.

The second gate resistor pattern GR2 may be disposed on a substrate 2 of the second chip C2. The second gate resistor pattern GR2 may be formed at the same process step as the gate electrode of a transistor included in a second peripheral circuit 140b, and may be made of the same material as the gate electrode of the transistor included in the second peripheral circuit 140b.

One end of the second gate resistor pattern GR2 may be coupled to the second peripheral circuit 140b through contacts 51a and 51b and a wiring line 61a, and the other end of the second gate resistor pattern GR2 may be coupled to the second vertical resistor pattern VR2 through contacts 51 to 54 and wiring lines 61 to 64.

The first gate resistor pattern GR1 may overlap with at least one of the first horizontal resistor pattern HR1 and the first vertical resistor pattern VR1 in the first direction FD. The second gate resistor pattern GR2 may overlap with at least one of the second horizontal resistor pattern HR2 and the second vertical resistor pattern VR2 in the first direction FD. Because the first gate resistor pattern GR1 shares a layout area with the first horizontal resistor pattern HR1 and/or the first vertical resistor pattern VR1, and the second gate resistor pattern GR2 shares a layout area with the second horizontal resistor pattern HR2 and/or the second vertical resistor pattern VR2, a higher resistance resulting from the overlapping structures may be configured in a smaller layout area.

The first vertical resistor pattern VR1, the first horizontal resistor pattern HR1 and the first gate resistor pattern GR1 included in the first chip C1 may configure a first resistor element R1. The second vertical resistor pattern VR2, the second horizontal resistor pattern HR2 and the second gate resistor pattern GR2 included in the second chip C2 may configure a second resistor element R2. The first pad PAD1 and the second pad PAD2 may be bonded to each other, and accordingly, the first resistor element R1 and the second resistor element R2 may be coupled to each other.

As described above, according to embodiments of the disclosure, by configuring a resistor element in each of a first chip and a second chip, and by coupling the resistor element of the first chip and the resistor element of the second chip through chip bonding, high resistance may be implemented in a smaller layout, and layout area consumption due to the presence of the resistor elements may be reduced, thereby contributing to the integration of a semiconductor device.

According to embodiments of the disclosure, it is possible to increase a line width of each resistor element without causing an increase in the size of the semiconductor device and a decrease in the resistance value of the resistor element. Therefore, since the heat generated in the resistor element may be reduced with an increase in line width, it is possible to suppress the occurrence of a failure in which a resistor and/or an adjacent wiring line is melted and thus uncoupled by the heat generated in the resistor element. It is also possible to avoid a failure in which the characteristics of an element such as an adjacent transistor and/or capacitor are degraded. Such improvements contribute to the greater yield and reliability of the semiconductor device.

Figure 5:
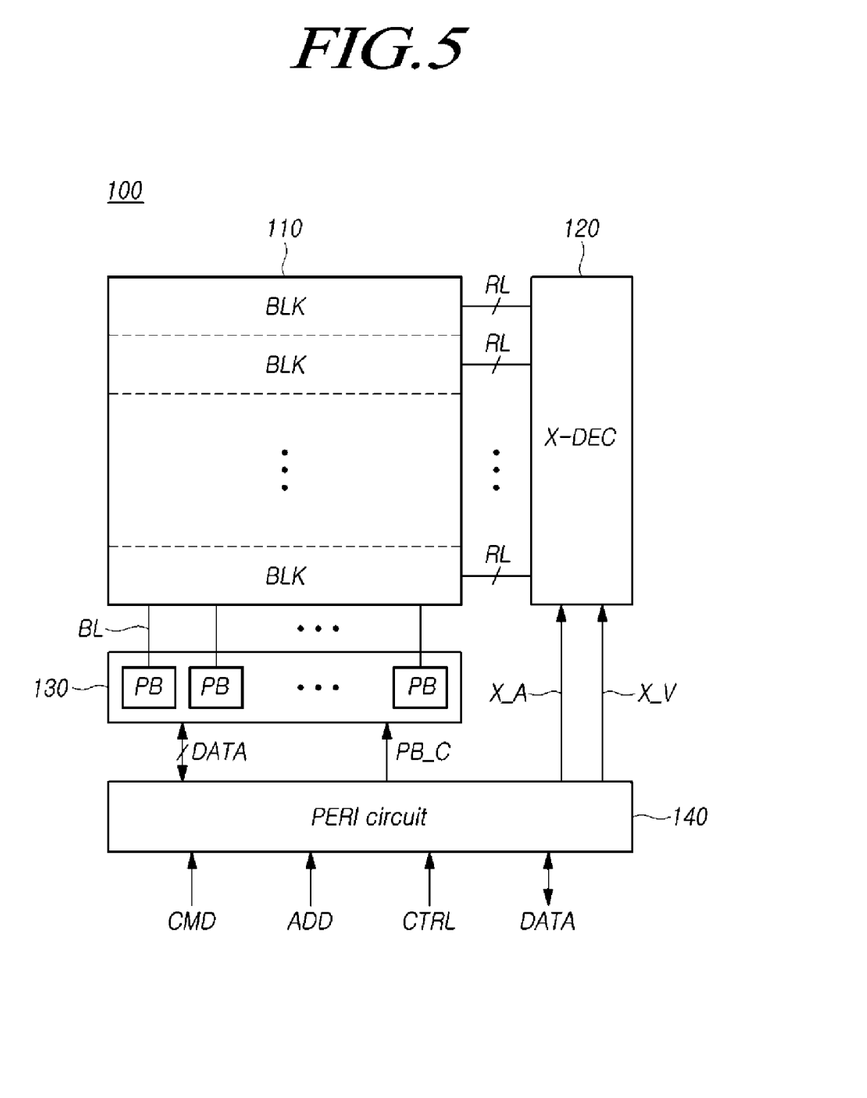
FIG. 5 is a block diagram illustrating a representation of an example of a semiconductor device in accordance with an embodiment of the disclosure.

FIG. 5 is a block diagram illustrating a representation of a semiconductor device in accordance with an embodiment of the disclosure.

Referring to FIG. 5, a semiconductor device 100 in accordance with an embodiment of the disclosure may include a memory cell array 110, a row decoder (X-DEC) 120, a page buffer circuit 130 and a peripheral circuit (PERI circuit) 140.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or a nonvolatile memory cell.

The memory cell array 110 may be coupled to the row decoder 120 through row lines RL. The row lines RL may include at least one drain select line, a plurality of word lines and at least one source select line. The memory cell array 110 may be coupled to the page buffer circuit 130 through bit lines BL.

The row decoder 120 may select any one among the memory blocks BLK included in the memory cell array 110 in response to a row address X_A provided from the peripheral circuit 140. The row decoder 120 may transfer an operating voltage X_V provided from the peripheral circuit 140, to row lines RL coupled to a memory block BLK that is selected from among the memory blocks BLK included in the memory cell array 110.

The page buffer circuit 130 may include a plurality of page buffers PB, which are coupled to the bit lines BL, respectively. The page buffer circuit 130 may receive a page buffer control signal PB_C from the peripheral circuit 140 and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from memory cells that are coupled to an activated word line.

The peripheral circuit 140 may receive a command signal CMD, an address signal ADD and a control signal CTRL from outside the semiconductor device 100, and may transmit and receive data DATA to and from a device outside the semiconductor device 100, such as for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor device 100. The peripheral circuit 140 may include one or more resistor elements according to embodiments of the disclosure.

Figure 6:
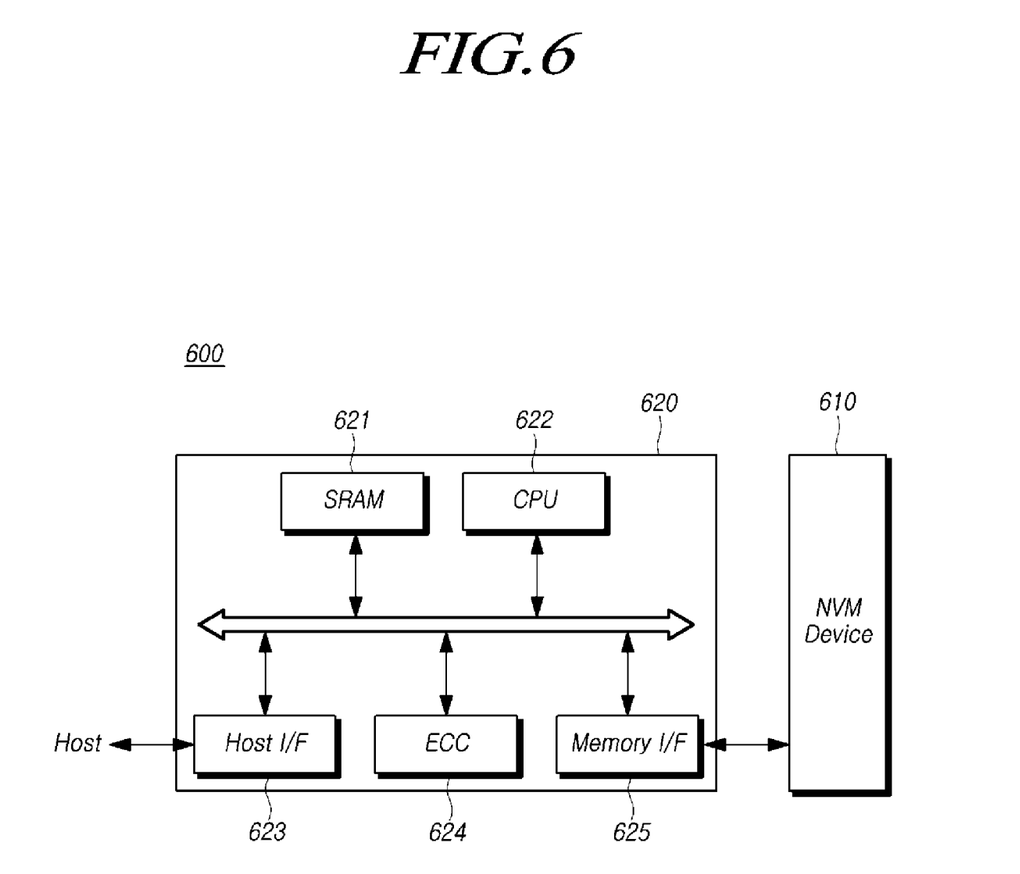
FIG. 6 is a block diagram schematically illustrating a memory system including a semiconductor device in accordance with an embodiment of the disclosure.

FIG. 6 is a block diagram schematically illustrating a memory system including a semiconductor memory device in accordance with an embodiment of the disclosure.

Referring to FIG. 6, a memory system 600 in accordance with an embodiment may include a nonvolatile memory device (NVM Device) 610 and a memory controller 620.

The nonvolatile memory device (NVM Device) 610 may be constituted by a semiconductor memory device described above and may operate in the manner described above. The memory controller 620 may be configured to control the nonvolatile memory device (NVM Device) 610. The combination of the nonvolatile memory device (NVM Device) 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 7:
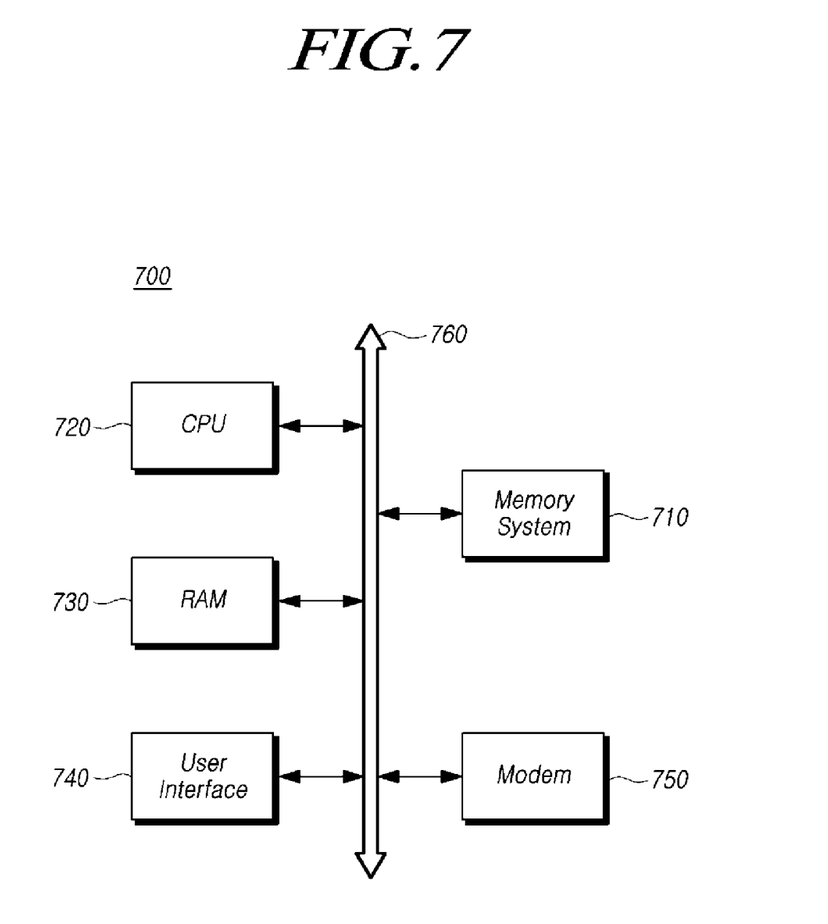
FIG. 7 is a block diagram schematically illustrating a computing system including a semiconductor device in accordance with an embodiment of the disclosure.

FIG. 7 is a block diagram schematically illustrating a computing system including a semiconductor memory device in accordance with an embodiment of the disclosure.

Referring to FIG. 7, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor device comprising:
 a first pad defined on one surface of a first chip, the first chip includes a memory cell array disposed in a cell region and a first peripheral circuit disposed in a peripheral region outside of the cell region;
 a second pad defined on one surface of a second chip, which is stacked on the first chip in a first direction, and bonded to the first pad, the second chip includes a second peripheral circuit in the peripheral region;
 a first vertical resistor pattern, defined in the first chip and coupled to the first pad, extending in the first direction;
 a second vertical resistor pattern defined in the second chip and coupled to the second pad, extending in the first direction; and
 a first gate resistor pattern disposed on a substrate of the first chip,
 wherein the first vertical resistor pattern and the second vertical resistor pattern are disposed between the first peripheral circuit and the second peripheral circuit in the peripheral region, and
 wherein at least a portion of the first vertical resistor pattern and at least a portion of the second vertical resistor pattern overlap each other in the first direction that is perpendicular to the one surface of the first chip and the one surface of the second chip.

2. The semiconductor device according to claim 1, wherein the first gate resistor pattern overlaps with at least one of the first vertical resistor pattern and the second vertical resistor pattern in the first direction.

3. The semiconductor device according to claim 1, further comprising:
 a second gate resistor pattern disposed on a substrate of the second chip and coupled to the second vertical resistor pattern.

4. The semiconductor device according to claim 3, wherein the second gate resistor pattern overlaps with at least one of the first vertical resistor pattern and the second vertical resistor pattern in the first direction.

* * * * *